United States Patent [19]
Takeda

[11] Patent Number: 6,144,601
[45] Date of Patent: Nov. 7, 2000

[54] SEMICONDUCTOR MEMORY HAVING AN IMPROVED READING CIRCUIT

[75] Inventor: Koichi Takeda, Tokyo, Japan

[73] Assignee: NEC Corporation, Tokyo, Japan

[21] Appl. No.: 09/354,599

[22] Filed: Jul. 16, 1999

[30] Foreign Application Priority Data

Jul. 16, 1998 [JP] Japan .................................. 10-201993

[51] Int. Cl.$^7$ ...................................................... G11C 7/00
[52] U.S. Cl. .......................................... 365/203; 365/205
[58] Field of Search .................................. 365/203, 205, 365/207, 208

[56] References Cited

U.S. PATENT DOCUMENTS

| | | | |
|---|---|---|---|
| 5,255,223 | 10/1993 | Tanaka ..................................... | 365/203 |
| 5,748,520 | 5/1998 | Asaka et al. ............................. | 365/205 |
| 6,018,481 | 1/2000 | Shiratake ................................. | 365/203 |

FOREIGN PATENT DOCUMENTS

| | | |
|---|---|---|
| 3-108187 | 5/1991 | Japan . |
| 10-69795 | 3/1998 | Japan . |

*Primary Examiner*—Trong Phan

[57] ABSTRACT

A DRAM comprises a first DRAM cell and a second DRAM cell connected to a first bit line and a second bit line, respectively, which constitute a pair of bit lines precharged to a reference potential and which are connected to a sense amplifier for comparing data stored in a memory cell selected from the first and second memory cells with a reference potential, so as to output the result of comparison as a read-out data. When a selected memory cell of the first and second memory cells is read out, a reference potential setting circuit sets the bit line associated to a non-selected memory of the first and second memory cells, to the reference potential at least one time during a period after the one of the first and second memory cells is selected to be read out and before the sense amplifier is activated.

18 Claims, 11 Drawing Sheets

SEMICONDUCTOR MEMORY HAVING AN IMPROVED READING CIRCUIT

BACKGROUND OF THE INVENTION

1. Field of the Invention

The present invention relates to a semiconductor memory, and more specifically to a dynamic random access memory having an improved reading circuit.

2. Description of Related Art

With recent advancement of a microfabrication technology, the proportion of a "coupling capacitance between bit lines" included in a bit line capacitance is increasing. The "coupling capacitance between bit lines" will be called an "inter-bitline coupling capacitance" in this specification. In a DRAM (dynamic random access memory), the increase of this inter-bitline coupling capacitance reduces a potential difference between a pair of bit lines connected to the same sense amplifier. Here, the pair of bit lines includes a bit line to which data is outputted from a selected DRAM cell, and a bit line on which a reference potential is held. The potential difference between a pair of bit lines connected to the same sense amplifier will be called an "inter-bitline potential difference" in this specification.

First, the inter-bitline potential difference in a reading operation under an ideal condition having no inter-bitline coupling capacitance will be formulated. Referring to FIG. 1, there is shown a circuit diagram illustrating a portion of the construction of a prior art DRAM circuit.

In FIG. 1, a DRAM cell 100-1 and another DRAM cell 100-2 are respectively connected to a pair of bit lines BLT and BLN connected directly to the same sense amplifier 104, which is activated by a pair of complementary sense amplifier activation signals SAP and SAN. A gate of a switching transistor in the DRAM cell 100-1 is connected to a word line SWL1, and a gate of a switching transistor in the DRAM cell 100-2 is connected to another word line SWL2. The pair of bit lines BLT and BLN are precharged to a reference potential Vref by action of a precharge circuit 805 controlled by an activation signal PDL.

After the activation signal PDL is brought to a ground potential GND to deactivate the precharge circuit 805, for example, the word line SWL1 is brought to a potential Vboot so as to select the DRAM cell 100-1, so that data stored in the DRAM cell 100-1 is outputted to the bit line BLT. Here, assume that a capacitance in the DRAM cell is Cs, a bit line capacitance is Cb, and a potential in the DRAM cell is V1. On the other hand, an inter-bitline coupling capacitance Cc between the bit lines BLT and BLN is OfF (in the ideal condition in which the inter-bitline coupling capacitance is negligibly sufficiently small). In the reading operation, at this time, the potential of the bit line BLT changes from the reference potential Vref to $\{(Cs \cdot V1 + Cb \cdot Vref)/(Cs+Cb)\}$. Since the other bit line BLN is maintained at the reference potential Vref, the potential difference ($|VBLT-VBLN|$) between the bit lines BLT and BLN is expressed as follows:

$$|VBLT-VBLN| = \{Cs/(Cs+Cb)\} \cdot |V1-Vref| \qquad (1)$$

This potential difference expressed by the equation (1) is amplified by the sense amplifier 104.

The equation (1) is derived as follows: First, assume Cc=0fF in FIG. 1. Just before the word line SWL1 is brought to the high level potential Vboot, the capacitance and the potential of each of the bit lines BLT and BLN are Cb and Vref, so that the electric charge amount on each bit line is Cb×Vref, and on the other hand, the capacitance and the potential in the DRAM cell 100-1 are Cs and V1, so that the electric charge amount in the cell 100-1 is Cs×V1.

In this condition, if the word line SWL1 is brought to the high level potential Vboot to put the bit line BLT in a condition electrically connected to the DRAM cell 100-1, the potential of the bit line BLT becomes equal to the potential within the DRAM cell 100-1. Here, the potentials of the bit lines BLT and BLN after the bit line BLT and the DRAM cell 100-1 are electrically connected to each other, are called VBLT and VBLN, respectively. The electric charge amount on the bit line BLT is expressed as Cb×VBLT, the electric charge amount on the bit line BLN is expressed as Cb×VBLN, and the electric charge amount in the DRAM cell 100-1 is expressed as CS×VBLT.

Since the total electric charge amount of the bit line BLT and the DRAM cell 100-1 does not change, the following relation holds:

$$Cs \times V1 + Cb \times Vref = Cb \times VBLT + CS \times VBLT$$

Accordingly, $$VBLT = (Cs \times V1 + Cb \times Vref)/(Cs+Cb) \qquad (2)$$

On the other hand, since the electric charge amount of the bit line BLN does not change, the following relation holds:

$$Cb \times Vref = Cb \times VBLN$$

Accordingly, $$VBLN = Vref \qquad (3)$$

Thus, the equation (1) can be obtained by seeking a difference between the bit lines VBLT and VBLN from the equations (2) and (3).

A problem in the prior art is that with the increase of the inter-bitline coupling capacitance, the inter-bitline potential difference in the reading operation decreases, as mentioned hereinbefore. If the inter-bitline potential difference decreases, there occurs possibility that the potential difference cannot be properly amplified by the sense amplifier with the result that an erroneous information is outputted. In the following, why the inter-bitline potential difference decreases will be described with formulation.

The worst condition in the reading operation is that all the DRAM cells store the same data. Here, assume that the proportion of the inter-bitline coupling capacitance included in the bit line capacitance is "x", where $0 \leq x < 1$. Therefore, the coupling capacitance Cc is expressed as "x·Cb", and the bit line capacitance excluding the coupling capacitance is expressed as "(1−x)·Cb".

Under this condition, the word line SWL1 is brought to the potential Vboot so that the data stored in the DRAM cell 100-1 is read out and outputted to the bit line BLT of the pair of bit lines which were precharged to the reference potential Vref. At this time, the potential VBLT of the bit line BLT is expressed by the following equation (4), and the potential VBLN of the bit line BLN changes to a potential expressed by the following equation (5) because of the coupling capacitance between the bit lines BLT and BLN.

$$VBLT = \{(1-x^2) \cdot Cs \cdot Vref + Cs \cdot V1\}/\{(1-x^2) \cdot Cb + Cs\} \qquad (4)$$

$$VBLN = [\{(1-x^2) \cdot Cb + (1-x)Cs\} \cdot Vref + x \cdot Cs \cdot V1]/\{(1-x^2) \cdot Cb + Cs\} \qquad (5)$$

These equations (4) and (5) are derived as follows: First, assume Cc=x·Cb in FIG. 1 where 0<x<1. Just before the word line SWL1 is brought to the high level potential Vboot, the electric charge amount stored in the capacitance (1−x)

·Cb between the bit line BLT and a substrate is (1−x)·Cb×Vref, and the electric charge amount stored in the capacitance x·Cb between the bit line BLT and the bit line BLN is x·Cb×(Vref−Vref)=0 (zero). In addition, the electric charge amount stored in the capacitance (1−x)·Cb between the bit line BLN and the substrate is (1−x)·Cb×Vref, and the electric charge amount stored in the capacitance x·Cb between the bit line BLN and the bit line BLT is x·Cb×(Vref−Vref)=0 (zero). The electric charge amount in the cell 100-1 is Cs×V1.

In this condition, if the word line SWL1 is brought to the high level potential Vboot to put the bit line BLT in a condition electrically connected to the DRAM cell 100-1, the potential of the bit line BLT becomes equal to the potential within the DRAM cell 100-1. Here, the potentials of the bit lines BLT and BLN after the bit line BLT and the DRAM cell 100-1 are electrically connected to each other, are called VBLT and VBLN., respectively. The electric charge amount stored in the capacitance (1−x)·Cb between the bit line BLT and the substrate is (1−x)·Cb×VBLT, and the electric charge amount stored in the capacitance x·Cb between the bit line BLT and the bit line BLN is x·Cb×(VBLT−BLN). In addition, the electric charge amount stored in the capacitance (1−x)·Cb between the bit line BLN and the substrate is (1−x)·Cb×VBLN, and the electric charge amount stored in the capacitance x·Cb between the bit line BLN and the bit line BLT is x·Cb×(VBLN−VBLT). The electric charge amount in the cell 100-1 is Cs×VBLT.

Since the total electric charge amount of the bit line BLT and the DRAM cell 100-1 does not change, the following relation holds:

$$(1-x) \text{Cb} \times \text{Vref} + \text{Cs} \times \text{V1} = (1-x) \text{Cb} \times \text{VBLT} + x \cdot \text{Cb} \times (\text{VBLT} - \text{VBLN}) + \text{Cs} \times \text{VBLT} \quad (6)$$

Similarly, since the electric charge amount of the bit line BLN does not change, the following relation holds:

$$(1-x) \text{Cb} \times \text{Vref} = (1-x) \text{Cb} \times \text{VBLN} + x \cdot \text{Cb} \times (\text{VBLN} - \text{VBLL}) \quad (7)$$

Thus, the equations (4) and (5) can be obtained by solving the equations (6) and (7) as simultaneous equations. By seeking a difference between the bit lines VBLT and VBLN from the equations (4) and (5), the potential difference |VBLT−VBLN| can be obtained as follows:

$$|\text{VBLT}-\text{VBLN}|=[\text{Cs}/\{(1+x) \cdot \text{Cb} + \text{Cs}/(1-x)\}] \cdot |\text{V1}-\text{Vref}| \quad (8)$$

This equation is also true when the DRAM cell 100-2 is selected by bringing the word line SWL2 to the potential Vboot. In addition, assuming x=0, the equation (8) becomes the same as the equation (1). Respective coefficients (1+x) and 1/(1−x) for Cb and Cs included in the denominator are an increasing function for "x" (0≦x<1). Therefore, the equation (8) is a decreasing function for "x".

From the above mentioned relation, it is confirmed that the increase of the proportion "x" of the inter-bitline coupling capacitance will decrease the inter-bitline potential difference in the reading operation.

Japanese Patent Application Pre-examination Publication No. JP-A-10-069795 (an English abstract of which is available and the content of the English abstract is incorporated by reference in its entirety into this application) proposes to put a node at a reference potential side of the sense amplifier into a floating condition before the a selected word line is activated. However, this cannot solve the above mentioned problem of the prior art. Furthermore, Japanese Patent Application Pre-examination Publication No. JP-A-03-108187 (an English abstract of which is available and the content of the English abstract is incorporated by reference in its entirety into this application) proposes to vary the reference potential at the reading time. However, this cannot also solve the above mentioned problem of the prior art.

SUMMARY OF THE INVENTION

Accordingly, it is an object of the present invention to provide a semiconductor memory which has overcome the above mentioned problem of the prior art.

Another object of the present invention is to provide a semiconductor memory which has solved the decrease of the inter-bitline potential difference in the reading operation, caused by the increase of the inter-bitline coupling capacitance.

The above and other objects of the present invention are achieved in accordance with the present invention by a semiconductor memory comprising at least a first memory cell and a second memory cell associated to a first bit line and a second bit line, respectively, which constitute a pair of bit lines precharged to a reference potential before data is read out, a sense amplifier connected to the first and second bit lines and selectively activated for comparing, when one memory cell of the first and second memory cells is selected and electrically connected to the bit line associated with the selected memory cell, a potential on the bit line connected to the selected memory cell with a potential on the bit line associated with a non-selected memory cell of the first and second memory cell, so as to output the result of comparison as a read-out data, and a reference potential setting means connected to the first and second bit lines, for selectively setting the bit line associated with the non-selected memory cell to the reference potential.

In one embodiment, the reference potential setting circuit is configured to set the bit line associated with the non-selected memory cell to the reference potential during a period after the one memory cell of the first and second memory cells is actually selected but before the sense amplifier is activated. For this purpose, the reference potential setting circuit is so constructed to put the bit line associated with the non-selected memory cell into a condition electrically connected to a reference potential supplying line. For example, the reference potential setting circuit is composed of at least two transistors which are connected between the reference potential supplying line and the first and second bit lines, respectively, and which are independently controlled by different activation signals to electrically connect only the bit line associated with the non-selected memory cell to the reference potential supplying line. Here, each of the first and second memory cells is a DRAM memory cell.

With the above mentioned arrangement, since the bit line associated with the non-selected memory cell is electrically connected to the reference potential supplying line before the sense amplifier is activated, it is possible to reduce the decrease of the inter-bitline potential difference in the reading operation, caused by the increase of the inter-bitline coupling capacitance.

According to another aspect of the present invention, there is provided a DRAM comprising at least a first bit line and a second bit line which constitute a pair of bit lines precharged to a reference potential before data is read out, a first DRAM cell having a first storage capacitor having one end connected to ground and a first switching transistor having a main current path connected between the first bit line and the other end of the first storage capacitor, a control electrode of the first switching transistor being connected to a first word line, a second DRAM cell having a second storage capacitor having one end connected to the ground and a second switching transistor having a main current path connected between the second bit line and the other end of the second storage capacitor, a control electrode of the second switching transistor being connected to a second word line, a sense amplifier connected to the first and second bit lines and selectively activated for comparing, when the first switching transistor of the first DRAM cell is turned on by activating the first word line, a potential on the first bit line with a potential on the second bit line, so as to amplify a potential difference between the first and second bit lines, and a reference potential setting means connected to the first and second bit lines, for selectively setting the second bit line to the reference potential after the first switching transistor of the first DRAM cell is turned on by activating the first word line but the sense amplifier is activated.

In a preferred embodiment, a precharge circuit is connected to the first bit line and the second bit line and a line for supplying the reference potential and is controlled to precharge both the first bit line and the second bit line to the reference potential before the first switching transistor of the first DRAM cell is turned on. This precharge circuit operates as the reference potential setting means, by setting the second bit line to the reference potential at least one time during a period after the first switching transistor of the first DRAM cell is turned on, but before the sense amplifier is activated.

In one specific embodiment, the precharge circuit includes a first MOS transistor having a source-drain path connected between the first bit line and the line for supplying the reference potential, a second MOS transistor having a source-drain path connected between the second bit line and the line for supplying the reference potential, a gate electrode of each of the first and second MOS transistors being connected to receive a first activation signal, a third MOS transistor having a source-drain path connected between the first bit line and the line for supplying the reference potential and having a gate electrode connected to receive a second activation signal, and a fourth MOS transistor having a source-drain path connected between the second bit line and the line for supplying the reference potential and a gate electrode connected to receive a third activation signal. When the first DRAM cell is selected to be read, first, both the first and second MOS transistor are turned on by the first activation signal to electrically connect the first bit line and the second bit line to the reference potential for the purpose of precharging the first bit line and the second bit line, and then, after the first and second MOS transistor are turned off by the first activation signal, the first switching transistor of the first DRAM cell is turned on by activating the first word line so that the first storage capacitor is electrically connected to the first bit line, and then, the fourth MOS transistor is turned on by the third activation signal to electrically connect the second bit line to the line for supplying the reference potential for the purpose of bringing the second bit line to the reference potential, and on the other hand, the third MOS transistor is maintained in an off condition by the second activation signal, and then, after the fourth MOS transistor is turned off by the third activation signal, the sense amplifier is activated.

Preferably, the precharge circuit can further include a fifth MOS transistor having a source-drain path connected between the first bit line and the second bit line and having a gate electrode connected to receive the first activation signal, so that when both the first and second MOS transistor are turned on by the first activation signal, the fifth MOS transistor is also turned on by the first activation signal for equalizing a potential on the first bit line and a potential on the second bit line.

In another specific embodiment, the precharge circuit includes a first MOS transistor having a source-drain path connected between the first bit line and the line for supplying the reference potential and having a gate electrode connected to receive a first activation signal, and a second MOS transistor having a source-drain path connected between the second bit line and the line for supplying the reference potential and a gate electrode connected to receive a second activation signal. When the first DRAM cell is selected to be read, first, both the first and second MOS transistor are turned on by the first activation signal and the second activation signal to electrically connect the first bit line and the second bit line to the line for supplying the reference potential for the purpose of precharging the first bit line and the second bit line to the reference potential, and then, after only the first MOS transistor is turned off by the first activation signal, the second MOS transistor is maintained in an on condition by the second activation signal, and the first switching transistor of the first DRAM cell is turned on by activating the first word line so that the first storage capacitor is electrically connected to tile first bit line, and on the other hand, the second bit line is maintained at the reference potential by action of the second MOS transistor which is maintained in the on condition, and then, after the second MOS transistor is put in an off condition by the second activation signal, the sense amplifier is activated.

Preferably, the precharge circuit can further include a third MOS transistor having a source-drain path connected between the first bit line and the second bit line and having a gate electrode connected to receive a third activation signal, so that when both the first and second MOS transistor arc turned on by the first activation signal and the second activation signal to precharge the first bit line and the second bit line to the reference potential, the third MOS transistor is also turned on by the third activation signal for equalizing a potential on the first bit line and a potential on the second bit line.

The above and other objects, features and advantages of the present invention will be apparent from the following description of preferred embodiments of the invention with reference to the accompanying drawings.

DESCRIPTION OF THE PREFERRED EMBODIMENTS

Figure 2:
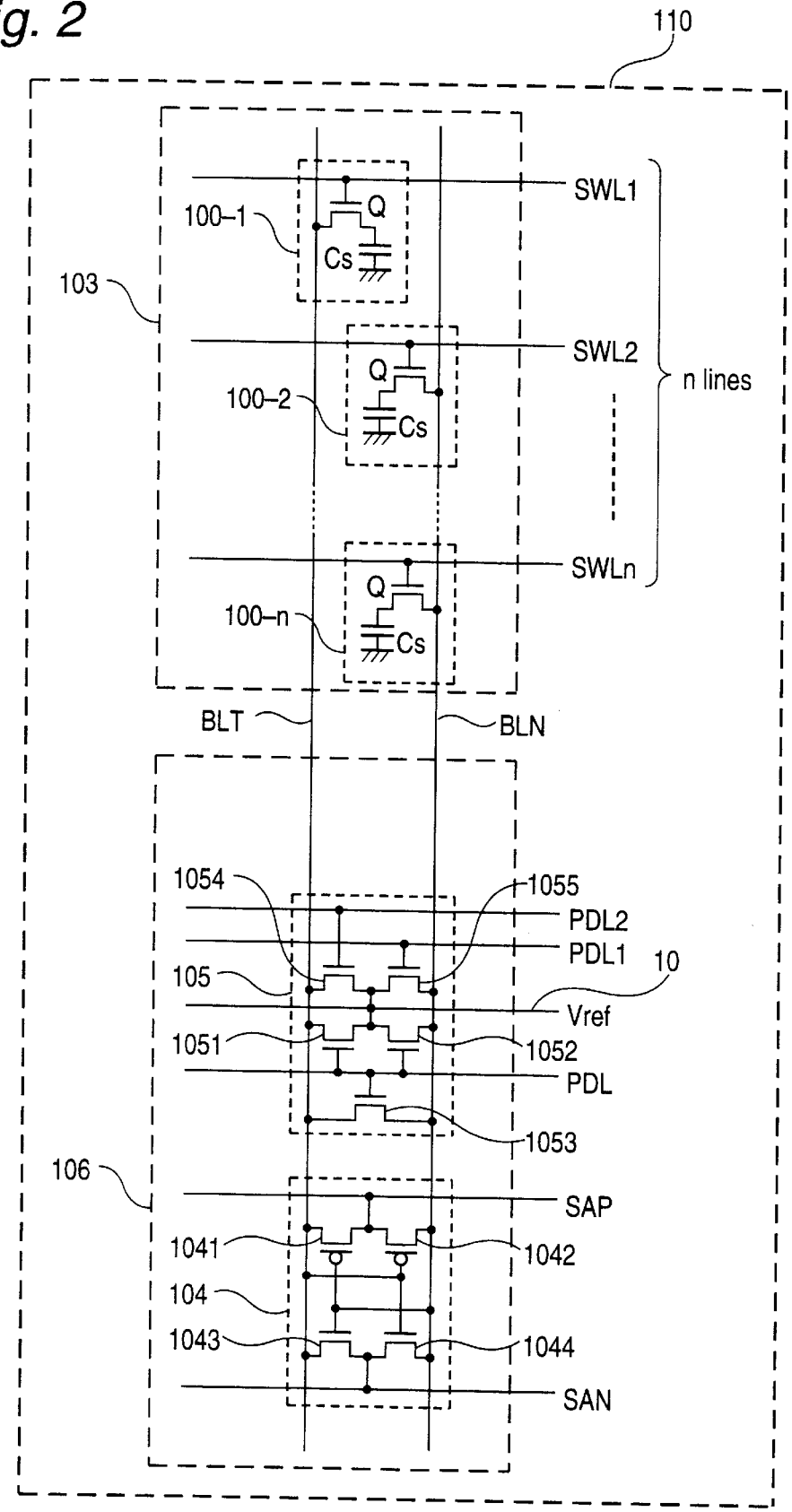
FIG. 2 is a circuit diagram illustrating a portion of a first embodiment of the semiconductor memory in accordance with the present invention.

Referring to FIG. 2, there is shown a circuit diagram illustrating a portion of a DRAM circuit which is a first embodiment of the semiconductor memory in accordance with the present invention.

The shown DRAM circuit is generally designated with the reference number 110, and includes a DRAM cell column 103 and a peripheral unitary circuit 106, which are connected to a pair of bit lines BLT and BLN, which are precharged with a reference potential so that when one DRAM cell is selected to be read out only the bit line connected to the selected DRAM cell changes to a potential which is lower or higher than the reference potential, in accordance with data stored in the selected DRAM cell.

The DRAM cell column 103 includes "n" DRAM cells 100-1, 100-2, . . . 100-n, which are alternately connected to the bit lines BLT and BLN, and "n" word lines SWL1, SWL2, . . . , SWLn connected to the "n" DRAM cells 100-1, 100-2, . . . 100-n, respectively, for selecting one of the "n" DRAM cells 100-1, 100-2, . . . 100-n. Here, "n" is a natural number not less than 2. For example, each of the "n" DRAM cells 100-1, 100-2, . . . 100-n is of a one-transistor one-capacitor type which includes one storage capacitor Cs having one end connected to ground and one switching transistor Q having a source-drain path (main current path) connected between the other end of the storage capacitor and a corresponding bit line of the bit lines BLT and BLN, a gate (control electrode) of the switching transistor being connected to a corresponding word line of the "n" word lines SWL1, SWL2, . . . , SWLn.

Here, when the DRAM cell 100-1 is selected, the bit line BLT becomes an operating bit line, and the bit line BLN becomes a reference potential bit line. Alternatively, when the DRAM cell 100-2 is selected, the bit line BLN becomes an operating bit line, and the bit line BLT becomes a reference potential bit line.

On the other hand, the peripheral unitary circuit 106 includes a sense amplifier 104 and a precharge circuit 105, which are connected to the pair of bit lines BLT and BLN. The sense amplifier 104 is activated by a pair of complementary sense amplifier activation signals SAP and SAN. In brief, the sense amplifier 104 includes a pair of P-channel MOS transistors 1041 and 1042 having sources connected in common to a line of the activation signal SAP. Drains of the P-channel MOS transistors 1041 and 1042 are connected to the bit lines BLT and BLN, respectively. The sense amplifier 104 also includes a pair of N-channel MOS transistors 1043 and 1044 having sources connected in common to a line of the activation signal SAN. Drains of the N-channel MOS transistors 1043 and 1044 are connected to the bit lines BLT and BLN, respectively. A gate of the P-channel MOS transistor 1041 and a gate of the N-channel MOS transistor 1043 are connected to each other and connected to the bit line BLN, and a gate of the P-channel MOS transistor 1042 and a gate of the N-channel MOS transistor 1044 are connected to each other and connected to the bit line BLT. Since an operation of this sense amplifier is well known, further explanation will be omitted.

The precharge circuit 105 is controlled by three activation signals PDL, PDL1 and PDL2. In brief, the precharge circuit 105 includes three N-channel MOS transistors 1051, 1052 and 1053 having respective gates connected in common to a line of the signal activation signal PDL. One of a source and a drain of each of the N-channel MOS transistors 1051 and 1052 is connected to a line 10 for supplying a reference potential Vref. The other of the source and the drain of the N-channel MOS transistor 1051 is connected to the bit line BLT, and the other of the source and the drain of the N-channel MOS transistor 1052 is connected to the bit line BLN. A source-drain path of the N-channel MOS transistor 1053 is connected between the bit lines BLT and BLN. The precharge circuit 105 also includes an N-channel MOS transistor 1054 having a gate connected to a line of the activation signal PDL2, and an N-,channel MOS transistor 1055 having a gate connected to a line of the activation signal PDL1. One of a source and a drain of each of the N-channel MOS transistors 1054 and 1055 is connected to the line 10 for supplying the reference potential Vref. The other of the source and the drain of the N-channel MOS transistor 1054 is connected to the bit line BLT, and the other of the source and the drain of the N-channel MOS transistor 1055 is connected to the bit line BLN.

With this arrangement, when the word Line SWL1 is brought to a potential Vboot so as to select the DRAM cell 100-1 so that data is read out to one bit line BLT of the pair of bit lines, the activation signal PDL1 for the precharge circuit 105 is brought to a potential Vint during, a period after the word line SWL1 is brought to the potential Vboot but before the sense amplifier 106 is activated, so that the other bit line BLN is put in a condition electrically connected to the line 10 for supplying the reference potential Vref. Similarly, when the word line SWL2 is brought to the potential Vboot so as to select the DRAM cell 100-2 so that data is read out to one bit line BLN of the pair of bit lines, the activation signal PDL2 for the precharge circuit 105 is brought to the potential Vint during, a period after the word line SWL2 is brought to the potential Vboot but before the sense amplifier 106 is activated, so that the other bit line BLT is put in a condition electrically connected to the line 10 for supplying the reference potential Vref.

Here, if VBLN=Vref is substituted into the equation (5), x=0 can be obtained. This means that if the reference potential bit line is electrically connected to the line 10 for supplying the reference potential Vref, the inter-bitline coupling capacitance can be equivalently made to 0fF. Accordingly, the inter-bitline potential difference in the reading operation can be enlarged to the potential difference in an ideal condition.

Now, an operation of the circuit shown in FIG. 2 will be described with reference to FIG. 3, which is a timing chart illustrating an operation of the semiconductor memory shown in FIG. 2. The activation signal PDL is brought to the potential Vint during the period of a precharge cycle from a time t1 to a time t2, so that the transistors 1051, 1052 and 1053 are turned on, with the result that all the bit lines are precharged to the reference potential Vref. At a time t3 after a time t2, a selected word line SWL1 is brought to the potential Vboot to select the DRAM cell 100-1, so that the switching transistor Q of the DRAM cell 100-1 is turned on and the storage capacitor Cs is connected to the bit line BLT, with the result that the data stored in the DRAM cell 100-1 is outputted to the bit line BLT.

At a time t4 where the potential of the bit line BLT has become stable, the activation signals SAP and SAN are brought from Vint/2 to Vint and a ground potential GND, respectively, so as to activate the sense amplifier 104, so that the potential difference between the pair of bit lines BLT and BLN is amplified by the sense amplifier 104, and the amplified data is outputted between the pair of bit lines BLT and BLN and then restored in the DRAM cell 100-1. At a time t5 after the data has been restored in the DRAM cell 100-1, the word line SWL1 is brought to the ground potential GND, and then, at a time t6, the activation signals SAP and SAN are returned to Vint/2 to deactivate the sense amplifier 104. In the above mentioned reading operation, in order to prevent the reference potential bit line BLN paired with the operating bit line BLT, from varying from the reference potential Vref because of the inter-bitline coupling capacitance, the activation signal PDL1 is brought to the potential Vint at least one time during a period from the time t3 to the time t4, so that the transistor 1054 is turned on with the result that the second bit line BLN (reference potential bit line) is electrically connected to the line 10 for the reference potential Vref and therefore is set to the reference potential Vref. Here, the activation signal PDL1 can be maintained at the potential Vint from the time t1 to the time t3 or further to a time just before the sense amplifier is activated.

Figure 3:
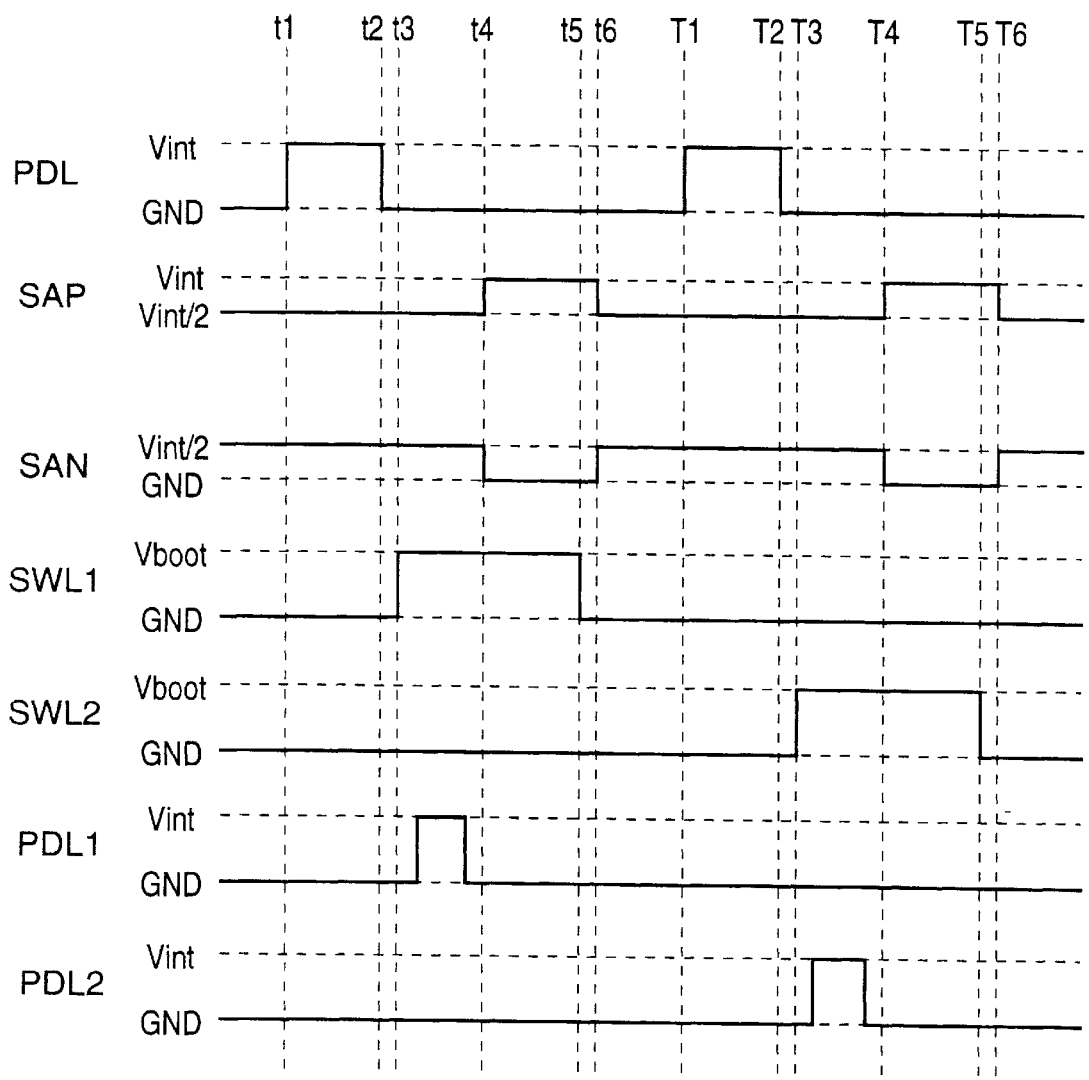
FIG. 3 is a timing chart illustrating an operation of the semiconductor memory shown in FIG. 2.

On the other hand, when the word line SWL2 is brought to the potential Vboot, as seen from a time T1 to a time T6 in FIG. 3, the operating bit line and the reference potential bit line are replaced with each other, differently from the case that the word line SWL1 is brought to the potential Vboot. Therefore, the activation signal PDL2 is brought to the potential Vint at least one time during a period from a time T3 to a time T4. Here, the activation signal PDL2 can be maintained at the potential Vint from a time T1 to the time T3 or further to a time just before the sense amplifier is activated.

As seen from the above, the activation signal PDL for the precharge circuit 106 controls the electrical connection between the pair of bit lines BLT and BLN, the electrical connection between the bit line BLT and the line 10 for supplying the reference potential Vref, and the electrical connection between the bit line BLN and the line 10 for supplying the reference potential Vref. The activation signal PDL1 controls the electrical connection between the reference bit line BLN and the line 10 for supplying the reference potential Vref. The activation signal PDL2 controls the electrical connection between the reference bit line BLT and the line 10 for supplying the reference potential Vref. Therefore, the transistors 1051, 1052 and 1053 constitute a precharge circuit section, and the transistors 1054 and 1055 constitute a reference potential setting circuit.

Incidentally, the sense amplifier 104 is in no way limited to the circuit construction shown in FIG. 2, but can be constituted of any circuit which is activated by one or more sense amplifier activation signals to amplify a potential difference between a pair of bit lines and to output an amplified potential difference to the same pair of bit lines.

Furthermore, the precharge circuit 105 is in no way limited to the circuit construction shown in FIG. 2, but can be constituted of any circuit which is controlled by a plurality of activation signals to control the electrical connection between the pair of bit lines BLT and BLN, the electrical connection between the bit line BLT and the line 10 for supplying the reference potential Vref, and the electrical connection between the bit line BLN and the line 10 for supplying the reference potential Vref, independently of one another. For example, the shown precharge circuit 105 is constituted of only the N-channel MOS transistors, but can be constituted of only P-channel MOS transistors, by inverting the polarity of each transistor.

Figure 4:
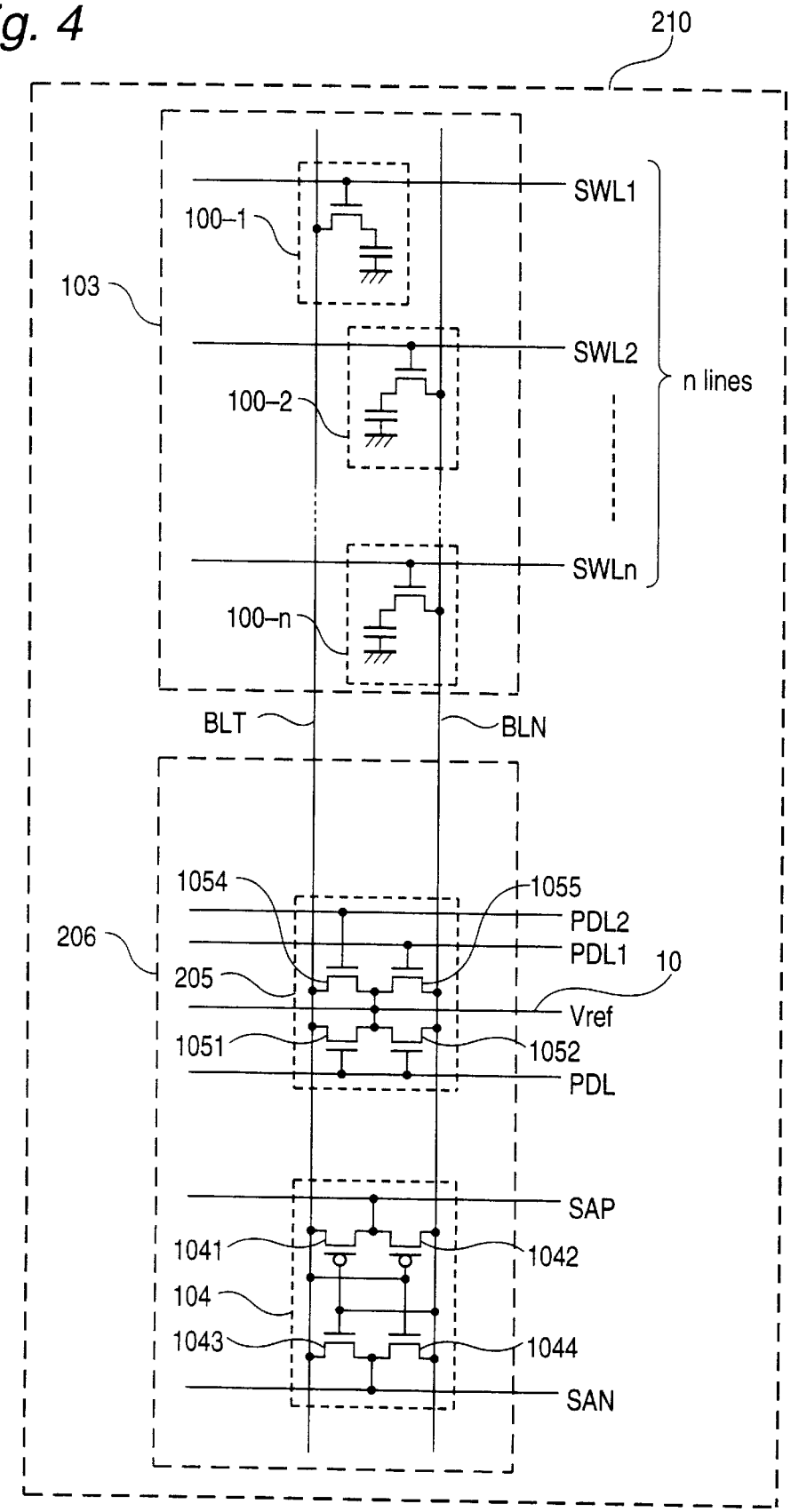
FIG. 4 is a circuit diagram illustrating a portion of a second embodiment of the semiconductor memory in accordance with the present invention.

Referring to FIG. 4, there is shown a circuit diagram illustrating a portion of a DRAM circuit which is a second embodiment of the semiconductor memory in accordance with the present invention. In FIG. 4, elements corresponding to those shown in FIG. 2 are given the same reference numbers, and explanation will be omitted for simplification of description.

The shown DRAM circuit is generally designated with the reference number 210, and includes a DRAM cell column 103 and a peripheral unitary circuit 206, which are connected to a pair of bit lines BLT and BLN. The peripheral unitary circuit 206 includes a sense amplifier 104 and a precharge circuit 205, which are connected to the pair of bit lines BLT and BLN.

As seen from comparison between FIG. 2 and FIG. 4, the second embodiment is different from the first embodiment only in that the transistor 1053 provided in the first embodiment for controlling the electrical connection between the pair of bit lines BLT and BLN, is omitted in the second embodiment. Accordingly, the same signals as the signals inputted to the DRAM circuit 110 of the first embodiment are inputted to the DRAM circuit 210 of the second embodiment.

Since the second embodiment operates similarly to the first embodiment, explanation of an operation of the second embodiment will be omitted.

Incidentally, the precharge circuit 205 is in no way limited to the circuit construction shown in FIG. 4, but can be can be constituted of only P-channel MOS transistors, by inverting the polarity of each transistor.

Figure 5:
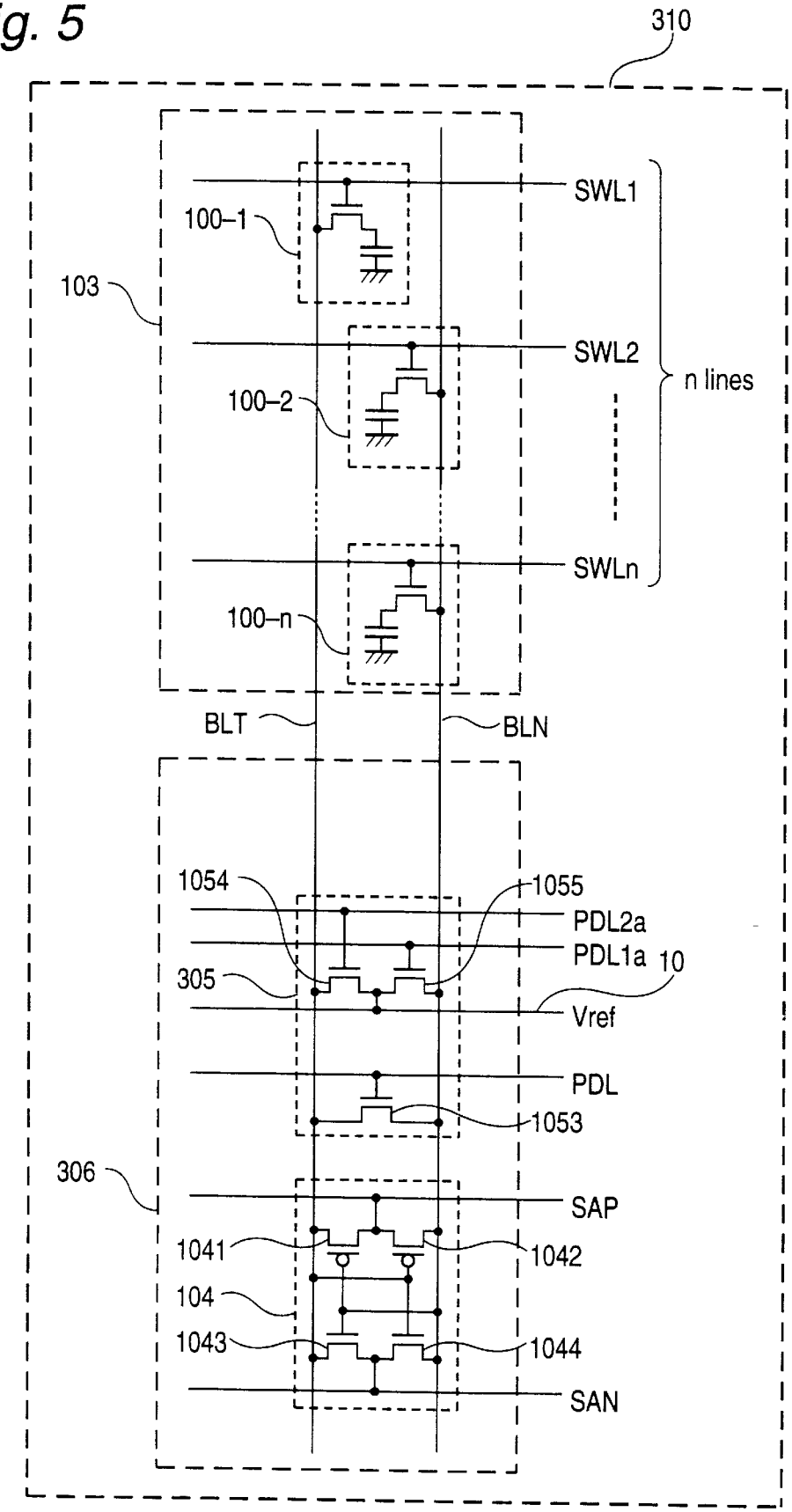
FIG. 5 is a circuit diagram illustrating a portion of a third embodiment of the semiconductor memory in accordance with the present invention.

Referring to FIG. 5, there is shown a circuit diagram illustrating a portion of a DRAM circuit which is a third embodiment of the semiconductor memory in accordance with the present invention. In FIG. 5, elements corresponding to those shown in FIG. 2 are given the same reference numbers, and explanation will be omitted for simplification of description.

The shown DRAM circuit is generally designated with the reference number 310, and includes a DRAM cell column 103 and a peripheral unitary circuit 306, which are connected to a pair of bit lines BLT and BLN. The peripheral unitary circuit 306 includes a sense amplifier 104 and a precharge circuit 305, which are connected to the pair of bit lines BLT and BLN.

As seen from comparison between FIG. 2 and FIG. 5, the second embodiment is different from the first embodiment only in that the transistors 1051 and 1052 provided in the first embodiment for controlling the electrical connection between the bit line BLT and the reference potential line 10 and the electrical connection between the bit line BLN and the reference potential line 10, respectively, are omitted in the third embodiment, and the transistor 1054 for controlling the electrical connection between the bit line BLT and the reference potential line 10 and the transistor 1055 for controlling the electrical connection between the bit line BLN and the reference potential line 10, are controlled by activation signals PDL1*a* and PDL2*a*, which are different from the activation signals PDL1 and PDL2 used in the first embodiment.

In this third embodiment, the activation signal PDL controls only the transistor 1053 for controlling the electrical connection between the pair of bit lines BLT and BLN. On the other hand, the activation signals PDL1*a* and PDL2*a* controls the transistors 1054 and 1055 to control the electrical connection between the bit line BLT and the reference potential line 10 and the electrical connection between the bit line BLN and the reference potential line 10, respectively, for the purpose of precharging the pair of bit lines BLT and BLN, similarly to the activation signal PDL, and also to control the electrical connection between the bit line of the non-selected DRAM cell and the reference potential line 10, for setting the bit line associated to the non-selected DRAM cell to the reference potential Vref, similarly to the activation signals PDL1 and PDL2.

Accordingly, it is sufficient if the activation signal PDL1$a$ is an logic-OR of the activation signal PDL and the activation signal PDL1, and if the activation signal PDL2$a$ is an logic-OR of the activation signal PDL and the activation signal PDL2. However, for simplification of control, as shown in the timing chart of FIG. 6 illustrating an operation of the semiconductor memory shown in FIG. 5, the activation signal PDL1$a$ can be modified to rise up at the time t1, in synchronism with the rising of the activation signal PDL and to fall down just before the time t4, in synchronism with the falling of the activation signal PDL1, and the activation signal PDL2$a$ can be modified to rise up at the time T1, in synchronism with the rising of the activation signal PDL and to fall down just before the time T4, in synchronism with the falling of the activation signal PDL2.

Figure 6:
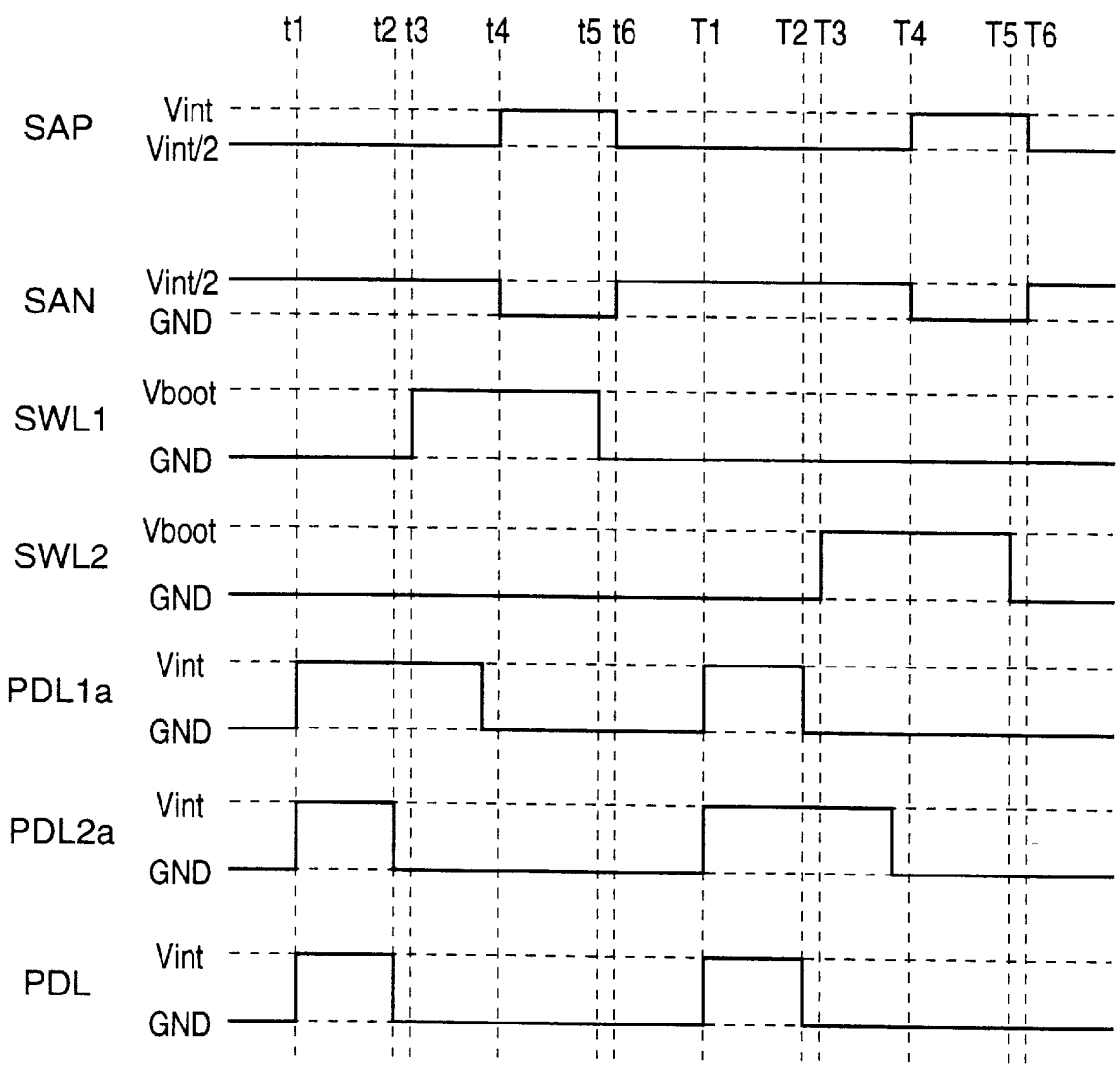
FIG. 6 is a timing chart illustrating an operation of the semiconductor memory shown in FIG. 5.

Since the timing chart of FIG. 6 is the same as the timing chart of FIG. 3 excluding the activation signals PDL1$a$ and PDL2$a$, further explanation of the operation of the third embodiment will be omitted.

Furthermore, the precharge circuit 305 is in no way limited to the circuit construction shown in FIG. 5, but can be constituted of any circuit which is controlled by a plurality of activation signals to control the electrical connection between the pair of bit lines BLT and BLN, the electrical connection between the bit line BLT and the line 10 for supplying the reference potential Vref, and the electrical connection between the bit line BLN and the line 10 for supplying the reference potential Vref, independently of one another. For example, the shown precharge circuit 305 can be constituted of only P-channel MOS transistors, by inverting the polarity of each transistor.

Figure 7:
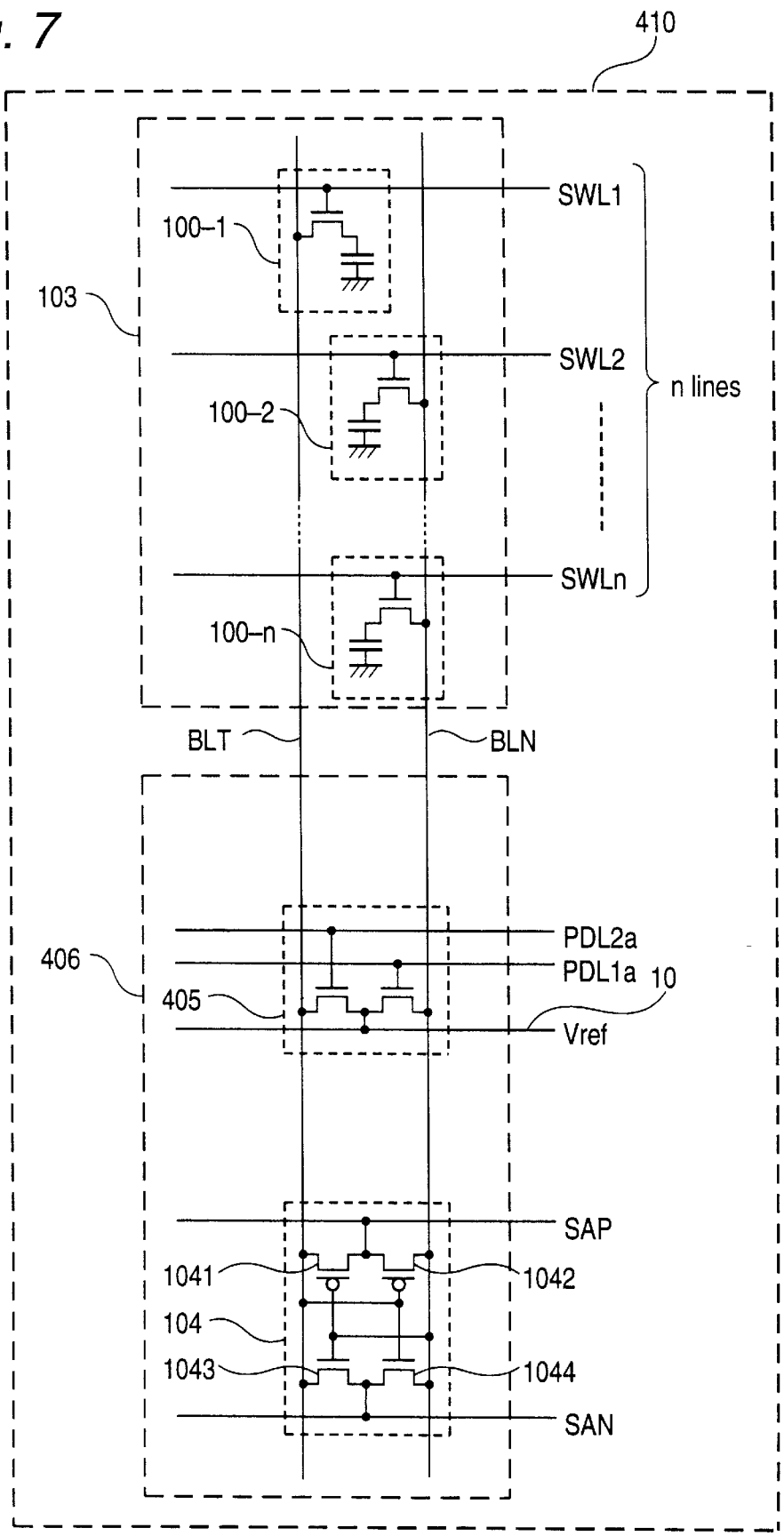
FIG. 7 is a circuit diagram illustrating a portion of a fourth embodiment of the semiconductor memory in accordance with the present invention.

Referring to FIG. 7, there is shown a circuit diagram illustrating a portion of a DRAM circuit which is a fourth embodiment of the semiconductor memory in accordance with the present invention. In FIG. 7, elements corresponding to those shown in FIG. 5 are given the same reference numbers, and explanation will be omitted for simplification of description.

The shown DRAM circuit is generally designated with the reference number 410, and includes a DRAM cell column 103 and a peripheral unitary circuit 406, which are connected to a pair of bit lines BLT and BLN. The peripheral unitary circuit 406 includes a sense amplifier 104 and a precharge circuit 405, which are connected to the pair of bit lines BLT and BLN.

As seen from comparison between FIG. 5 and FIG. 7, the fourth embodiment is different from the third embodiment only in that the transistor 1053 provided in the third embodiment for controlling the electrical connection between the bit line BLT and the bit line BLN is omitted in the fourth embodiment, and therefore, the activation signal PDL is not applied to the precharge circuit 405.

Since the fourth embodiment operates similarly to the third embodiment. except that the activation signal PDL is not applied to the precharge circuit 405, explanation of an operation of the fourth embodiment will be omitted.

Incidentally, the precharge circuit 405 is in no way limited to the circuit construction shown in FIG. 7, but can be can be constituted of only P-channel MOS transistors, by inverting the polarity of each transistor.

Figure 8:
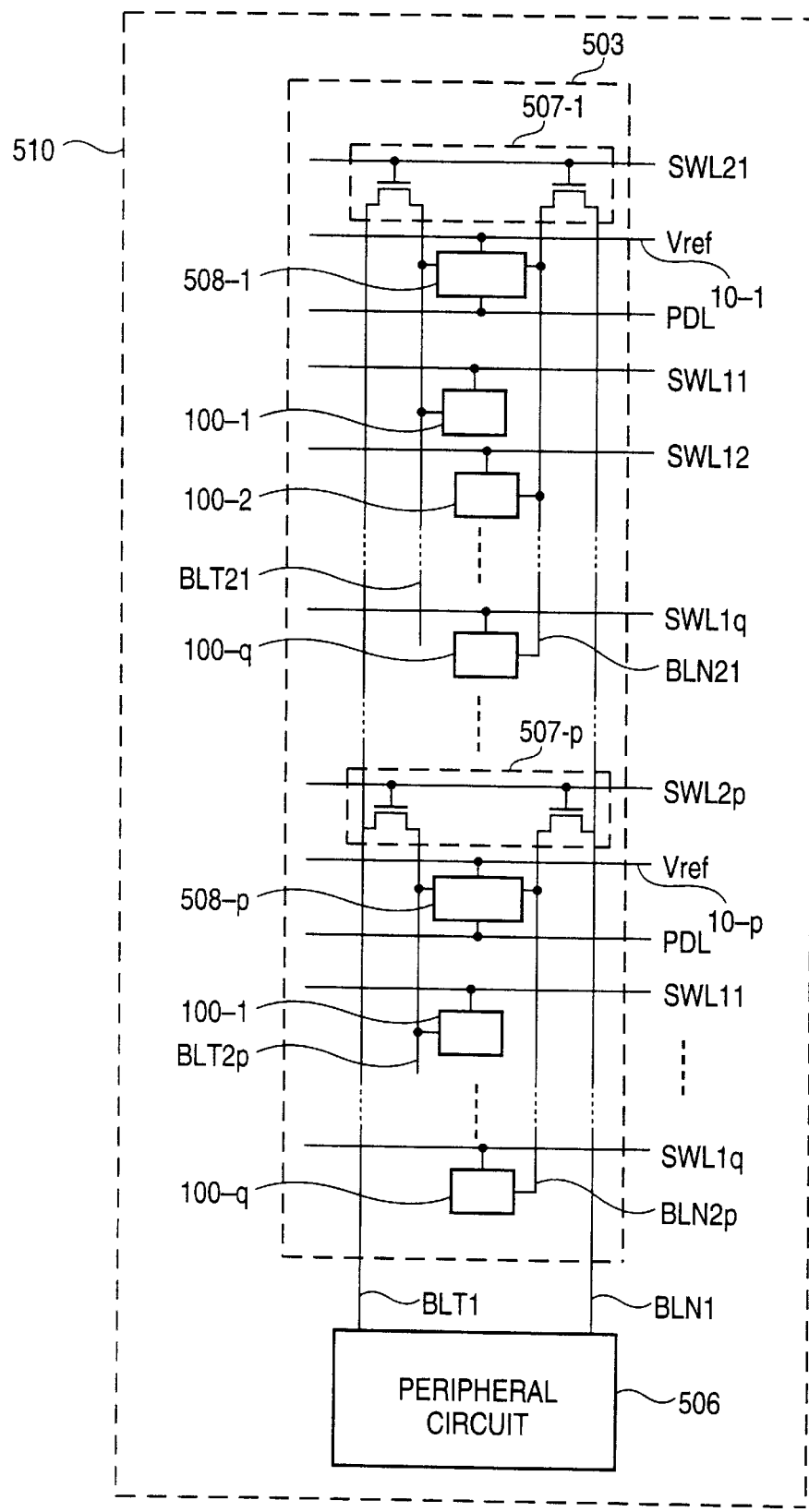
FIG. 8 is a circuit diagram illustrating a portion of a fifth embodiment of the semiconductor memory in accordance with the present invention.

Referring to FIG. 8, there is shown a circuit diagram illustrating a portion of a DRAM circuit which is a fifth embodiment of the semiconductor memory in accordance with the present invention.

The shown DRAM circuit is generally designated with the reference number 510, and includes a DRAM cell column 503 and a peripheral unitary circuit 506. The peripheral unitary circuit 506 can be constituted of any one of the peripheral unitary circuits 106, 206, 306 and 406 explained hereinbefore.

The DRAM cell column 503 has a two-layer structure obtained by dividing the bit lines of the DRAM circuit 110 shown in FIG. 2 into a pair of "layer 1" bit lines and a plurality of pairs of "layer 2" bit lines.

The pair of "layer 1" bit lines are constituted of a pair of bit lines BLT1 and BLN1 connected to the peripheral unitary circuit 506. The DRAM cell column 503 includes "p" pairs of "layer 2" bit lines BLT-2(i) and BLN-2(i), where "p" is a natural number not less than 2 and $1 \leq i \leq p$. To one pair of "layer 2" bit lines, "q" DRAM cells 100-(j) are connected, where "q" is a natural number not less than 2 and $1 \leq j \leq q$. The "q" DRAM cells 100-1 to 100-q are connected to "q" word lines SWL11 to SWL1q, respectively. Here, assuming that the DRAM cell column 103 shown in FIG. 2 is modified into the two-layer structure as shown in FIG. 8, n=p×q.

Figure 1:
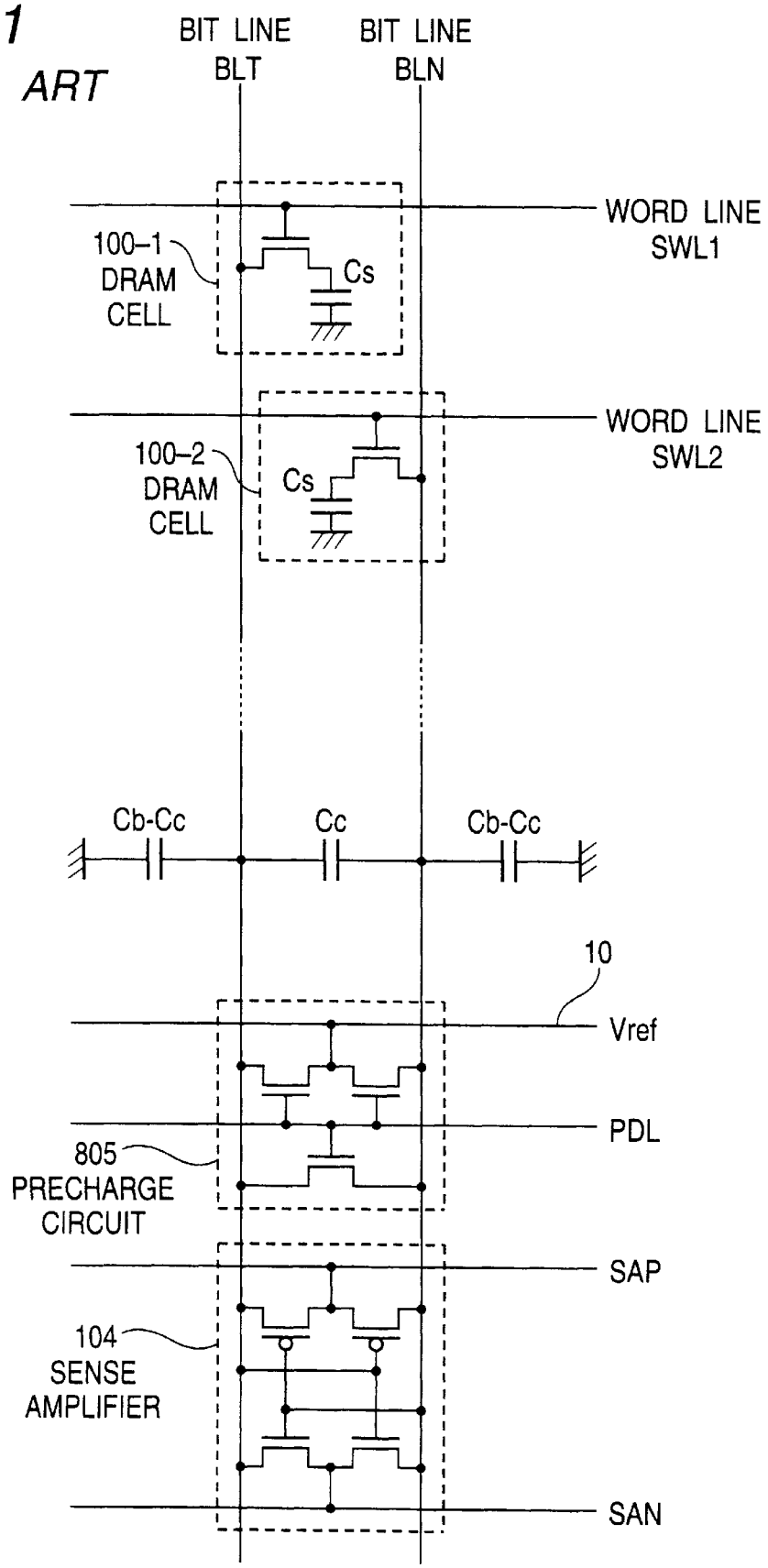
FIG. 1 is a circuit diagram illustrating a portion of the construction of a prior art DRAM circuit.

Each pair of "layer 2" bit lines BLT-2(i) and BLN-2(i) are respectively connected to the "layer 1" bit lines BLT1 and BLN1 through a layer-bitline selection circuit 507-(i), which is selectively activated by a corresponding selection signal SWL2(i). Furthermore, each pair of "layer 2" bit lines BLT-2(i) and BLN-2(i) are connected to an associated precharge circuit 508-(i), which is connected to a corresponding reference potential line 10-(i) for the reference potential Vref and is controlled by the precharge activation signal PDL. This precharge circuit 508-(i) can be constituted of the prior art precharge circuit 805 shown in FIG. 1. However, the precharge circuit 508-(i) is in no way limited to the prior art precharge circuit 805 shown in FIG. 1, but can be constituted of any circuit which is controlled by one activation signal to simultaneously control the electrical connection between the pair of hit lines BLT-2(i) and BLN-2(i), the electrical connection between the bit line BLT-2(i) and the corresponding reference potential line 10-(i), and the electrical connection between the bit line BLN-2(i) and the corresponding reference potential line 10-(i), or alternatively any circuit which is controlled by one activation signal to simultaneously control the electrical connection between the bit line BLT-2(i) and the corresponding reference potential line 10-(i) and the electrical connection between the bit line BLN-2(i) and the corresponding reference potential line 10-(i).

In the above mentioned arrangement, when the DRAM cell 100-(i) and the sense amplifier 104 (not shown in FIG. 8) included in the peripheral unitary circuit 506 are in an activated condition, if a selected layer-bitline selection circuit 507-(i) is activated, a pair of "layer 2" bit lines BLT2(i) and BLN2(i) associated to the activated bitline selection circuit 507-(i) are electrically connected to the pair of "layer 1" bit lines BLT1 and BLT1, respectively, so that the "layer 2" bit lines BLT2(i) and BLN2(i) and the "layer 1" bit lines BLT1 and BLT1 can be considered to be one pair of bit lines as a whole. Therefore, when the peripheral unitary circuit 506 is divided into a plurality of blocks, it is sufficient if each of the plurality of blocks is included in any level of layer.

Incidentally, the DRAM cell column 503 is in no way limited to the two-layer structure shown in FIG. 8, but can be in any layered structure having three or more layers.

In the above mentioned semiconductor memories, the peripheral unitary circuits 106, 206, 306, 406 and 506 are not necessarily required to be located in one place. Namely, the peripheral unitary circuits 106, 206, 306, 406 and 506 can be divided into a plurality of blocks, which are interconnected by long signal lines or one or more transistors which are turned on when the memory cell array is activated.

Figure 9:
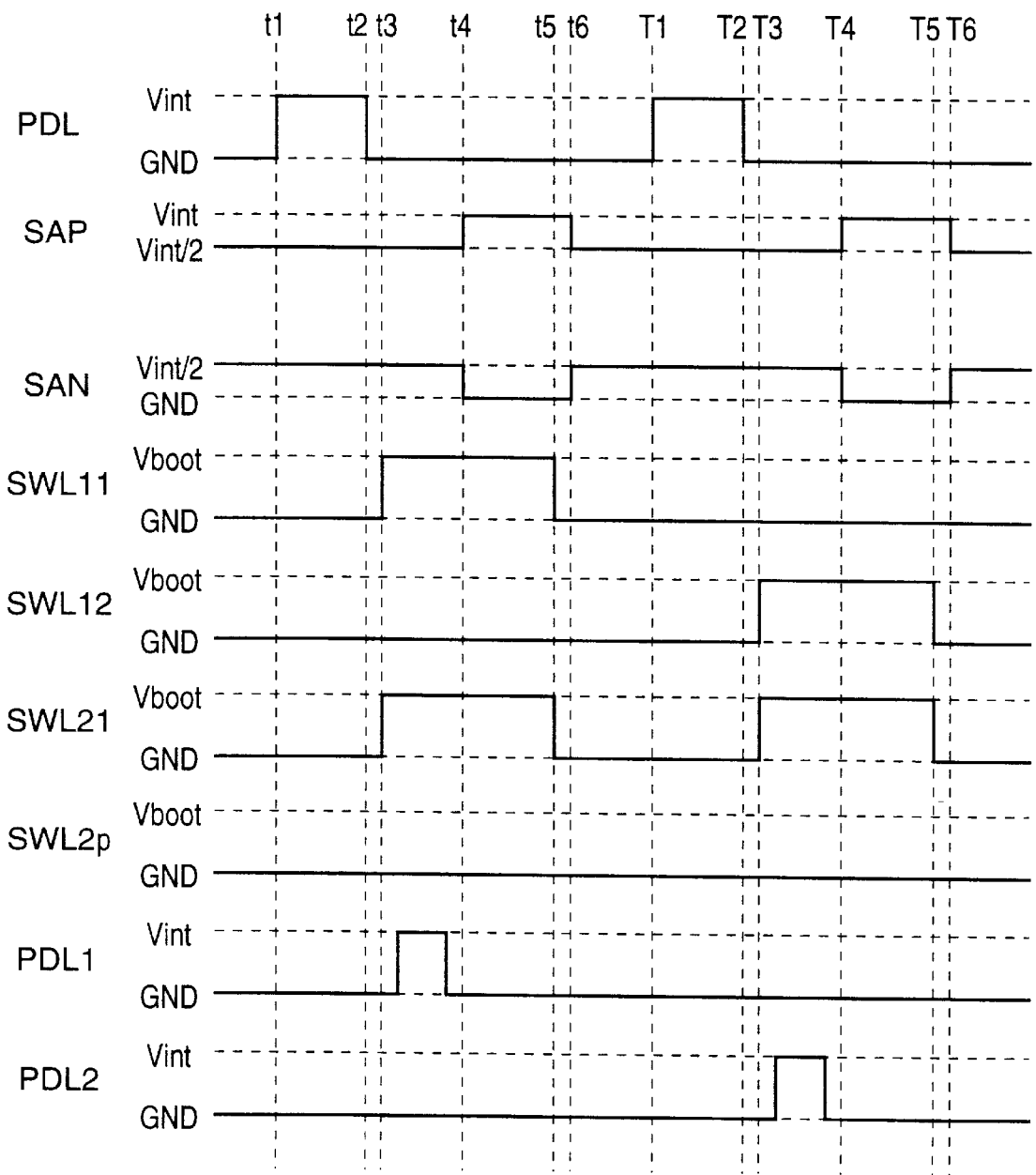
FIG. 9 is a timing chart illustrating an operation of the semiconductor memory shown in FIG. 8.

Referring to FIG. 9, there is shown a timing chart illustrating an operation of the semiconductor memory shown in FIG. 8 in the case that the peripheral unitary circuit 506 is constituted of the peripheral unitary circuit 106 or 206.

The activation signal PDL is brought to the potential Vint during the period of a precharge cycle from a time t1 to a time t2, so that all the bit lines BLT1 and BLN1 and BLT2(i) and BLN2(i) are precharged to the reference potential Vref. At a time t3 after a time t2, the selection signal line SWL21 and the word line SWL11 are brought to the potential Vboot (and on the other hand, the other selection signals SWL2(i) and the other word lines SWL1(J) are maintained at the ground level, where $2 \leq i \leq p$ and $2 \leq j \leq q$) so that the DRAM cell 100-1 associated to the "layer 2" bit line BLT21 is selected and the data stored in the DRAM cell 100-1 is outputted to the bit line BLT21, which is electrically connected to the "layer 1" bit line BLT1 through the selection circuit 507-1. At this time, the bit line BLN21 is electrically connected to the "layer 1" bit line BLN1 through the selection circuit 507-1.

At a time t4 where the potential of the "layer 2" bit line BLT21 and the "layer 1" bit line BLT1 have become stable, the activation signals SAP and SAN are brought from Vint/2 to Vint and a ground potential GND, respectively, so as to activate the sense amplifier 104 included in the peripheral unitary circuit 506, so that the potential difference between the pair of "layer 1" bit lines BLT1 and BLN1 is amplified by the sense amplifier 104, and the amplified data is outputted between the pair of "layer 1" bit lines BLT1 and BLN1 and then restored through the "layer 2" bit lines BLT21 and BLN21 into the DRAM cell 100-1. At a time t5 after the data has been restored in the DRAM cell 100-1, the selection signal line SWL21 and the word line SWL11 are brought to the ground potential GND, and then, the activation signals SAP and SAN are returned to Vint/2 to deactivate the sense amplifier 104.

In the above mentioned reading operation, in order to prevent the reference potential bit lines BLN21 and BLN1 paired with the operating bit lines BLT21 and BLT1, from varying from the reference potential Vref because of the inter-bitline coupling capacitance, the activation signal PDL1 is brought to the potential Vint at least one time during a period from the time t3 to the time t4, so that the reference potential bit lines BLN21 and BLN1 are brought again to the reference potential Vref.

On the other hand, when the selection signal line SWL21 and the word line SWL12 are brought to the potential Vboot, as seen from a time T1 to a time T6 in FIG. 9, the operating "layer 1" bit line and the reference "layer 1" bit line are replaced with each other, and the operating "layer 2" bit line and the reference "layer 2" bit line are replaced with each other, differently from the case that "layer 2" word line SWL11 are brought to the potential Vboot. Therefore, the activation signal PDL2 is brought to the potential Vint at least one time during a period from a time T3 to a time T4, so that the reference potential bit lines BLT21 and BLT1 are brought again to the reference potential Vref.

As seen from the above, the selection signal SWL21 is a logic OR of the word line signals SWL11 to SWL1q when the associated "layer 2" bit lines BLT21 and BLN21 are selected. The other selection signals SWL22 to SWL2p are maintained at the ground level GND since the associated "layer 2" bit lines BLT2(i) and BLN2(i) are not selected (where $2 \leq i \leq p$).

Figure 10:
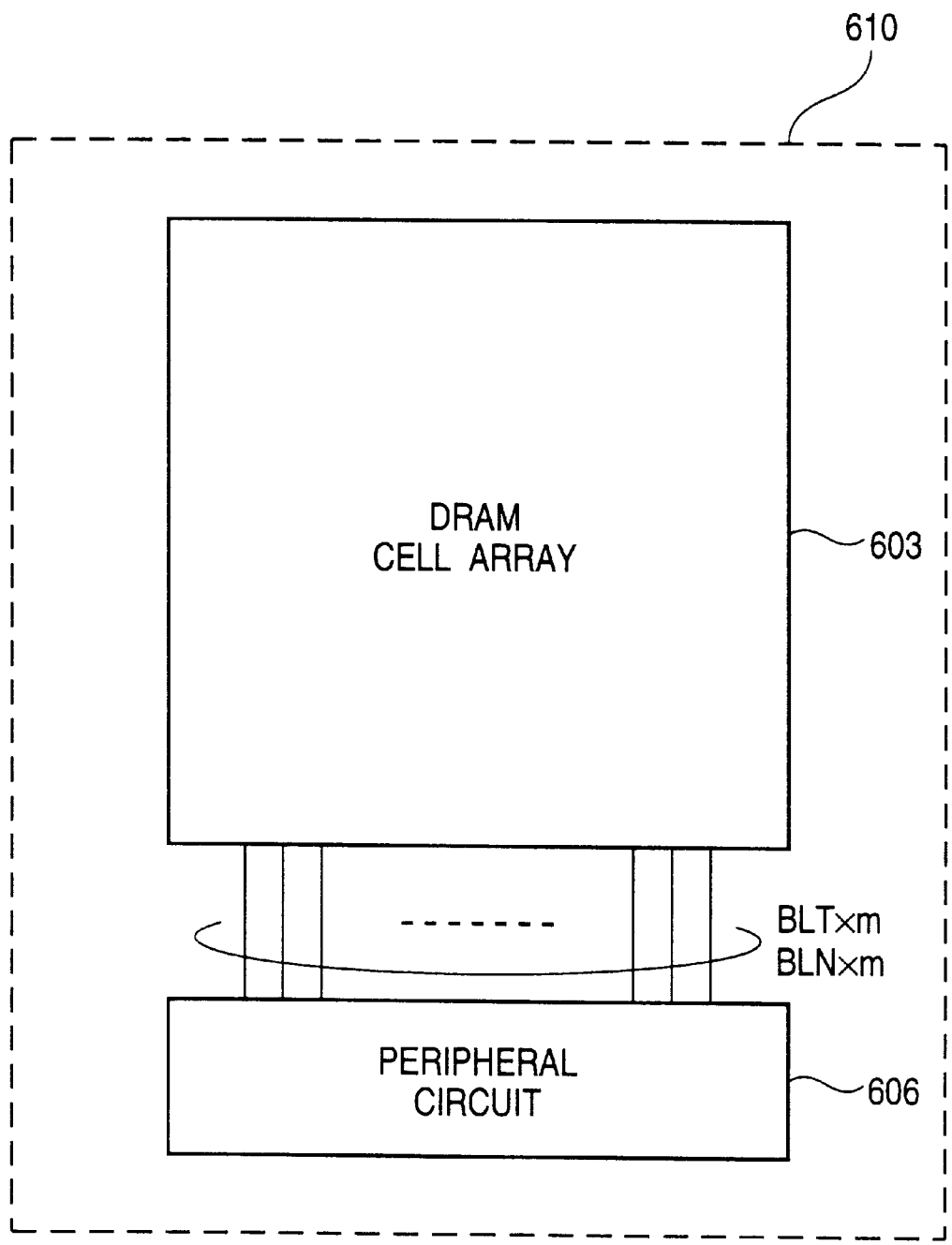
FIG. 10 is a circuit diagram illustrating a sixth embodiment of the semiconductor memory in accordance with the present invention.

Referring to FIG. 10, there is shown a circuit diagram illustrating a portion of a DRAM circuit which is a sixth embodiment of the semiconductor memory in accordance with the present invention. The shown DRAM circuit is generally designated with the reference number 610, and includes a DRAM cell array 603 and a peripheral circuit 606.

The DRAM cell array 603 includes "m" DRAM cell columns each of which is the same as the DRAM cell column 103 or 503, so that the DRAM cell array 603 is composed of "m×n" DRAM cells. The peripheral circuit 606 includes "m" peripheral unitary circuits each of which is the same as the peripheral unitary circuit 106, 206, 306 or 406. Here, "m" is a natural number not less than 2. Therefore, the DRAM circuit 610 can be considered to have been constituted by arranging "m" DRAM circuits each of which is the same as any of the DRAM circuits 110, 210, 310, 410 and 510. Therefore, the input signals supplied to the DRAM circuit 110, 210, 310, 410 or 510 are supplied to the DRAM circuit 610.

The DRAM cell array 603 is coupled to the peripheral circuit 606 through "2m" bit lines, which are composed of "m" pairs of bit lines BLT and BLN. In the shown DRAM circuit 610, one pair of bit lines BLT and BLN connected to the same peripheral unitary circuit are not necessarily required to be located adjacent to each other in the DRAM cell array 603. Therefore, between one pair of bit lines BLT and BLN connected to the same peripheral unitary circuit, bit lines connected to another or a plurality of other peripheral unitary circuits can be located.

Furthermore, the peripheral unitary circuits included in the peripheral circuit 606 are not necessarily located together in one place. For example, the peripheral circuit 606 can be divided into two blocks, which are located at opposite sides of the DRAM cell array 603

Figure 11:
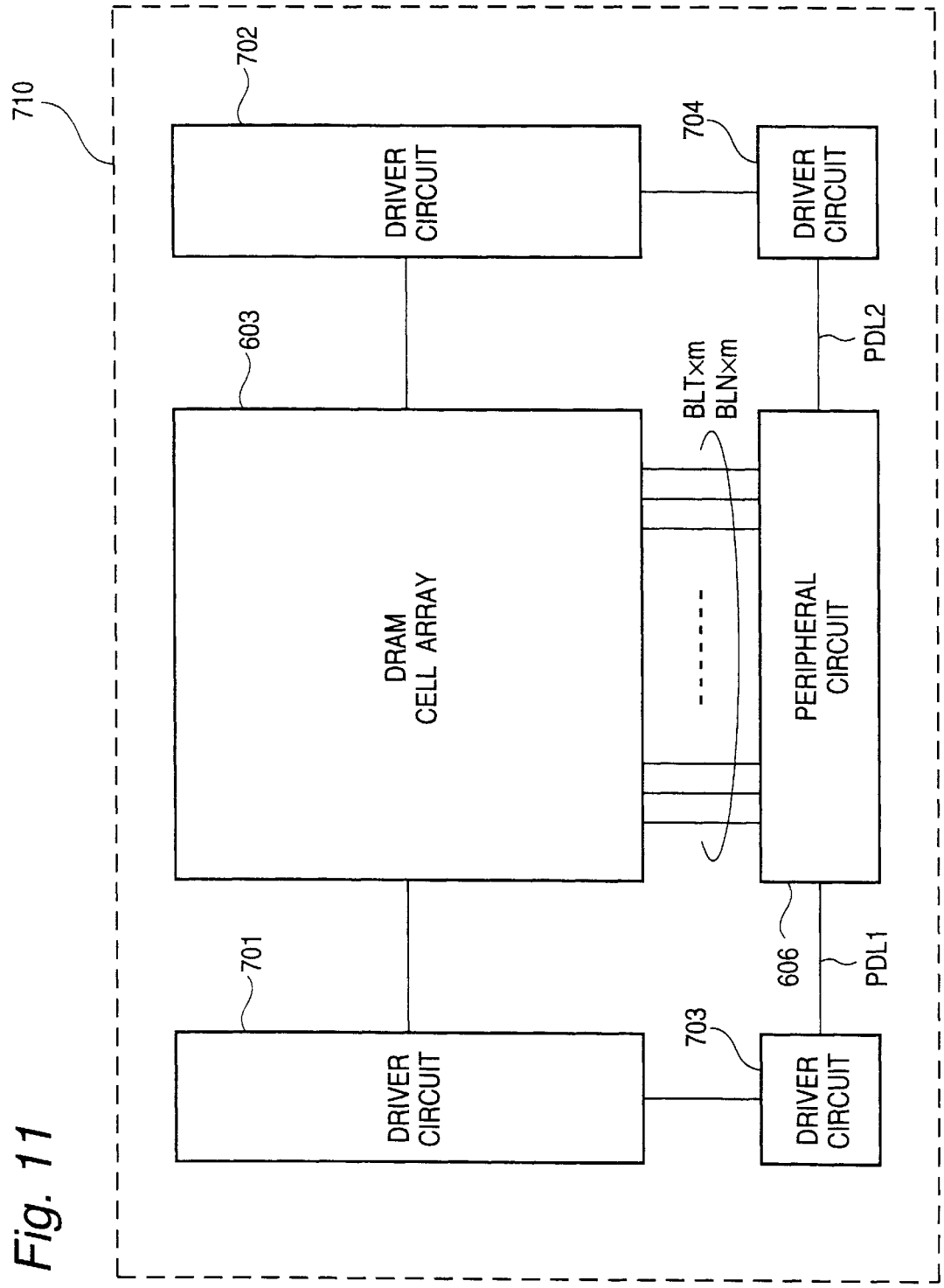
FIG. 11 is a circuit diagram illustrating a seventh embodiment of the semiconductor memory in accordance with the present invention.

Referring to FIG. 11, there is shown a circuit diagram illustrating a portion of a DRAM circuit which is a seventh embodiment of the semiconductor memory in accordance with the present invention. The shown DRAM circuit is generally designated with the reference number 710, and includes a DRAM cell array 603, a peripheral circuit 606, sub-word driver circuits 701 and 702, and activation signal driver circuits 703 and 704. The activation signal driver circuit 703 activates the activation signal PDL1 (or PDL1a) and the activation signal driver circuit 704 activates the activation signal PDL2 (or PDL2a).

In the DRAM cell array 603, all sub-word lines for selecting the DRAM cells associated to the bit line BLT are connected to the sub-word driver circuit 701. The activation signal driver circuit 703 is located at the same side of the DRAM cell array 603, as the side where the sub-word driver circuit 701 is located.

In addition, all sub-word lines for selecting the DRAM cells associated to the bit line BLN are connected to the sub-word driver circuit 702. The activation signal driver circuit 704 is located at the same side of the DRAM cell array 603, as the side where the sub-word driver circuit 702 is located.

Since the driver circuits 701 and 703 are located at the same side of the DRAM cell array 603 and the driver circuits 702 and 704 are located at the opposite and same side of the DRAM cell array 603, it is possible to shorten signal lines connecting between the driver circuits 701 and 703 and signal lines connecting between the driver circuits 702 and 704. Thus, not only a physical restriction can be minimized in a layout design, but also a clock signal skew can be minimized.

Here, an advantage obtained when the DRAM circuit is constructed as shown in any of FIGS. 2, 4, 5, 7, and 10, will be described. For example, when the DRAM circuit is constructed on the basis of 0.25 μm rule, the proportion "x" of the inter-bitline coupling capacitance included in the bit line capacitance is 0.2 (x=0.2). In addition, Cs/Cb=⅛. Under this condition, the inter-bitline potential difference expressed by the equation (8) can be given as follows:

$$|VBLT-VBLN|=0.0922 \cdot |V1-Vref| \qquad (9)$$

On the other hand, since "x" can be equivalently made 0 (zero) in the DRAM circuit constructed as shown in any of FIGS. 2, 4. 5, 7, and 10, the inter-bitline potential difference expressed by the equation (1) can be given as follows:

$$|VBLT-VBLN|=0.1111 \cdot |V1-Vref| \qquad (10)$$

As a result, the above mentioned DRAM circuit 110, 210, 310, 410, 510 and 610 can increase the inter-bitline potential difference about 1.2 times, in comparison with the prior art DRAM circuit. Accordingly, it is possible to increase the number of DRAM cells associated lo one bit line, and therefore, to elevate the degree of integration.

As seen from the above, according to the present invention, it is possible to avoid the decrease of the inter-bitline potential difference in the reading operation, caused by the increase of the inter-bitline coupling capacitance, by electrically connecting, of a pair of bit lines connected to the same sense amplifier, the bit line which is not connected to a selected memory cell, to the reference potential line before the sense amplifier is activated.

The invention has thus been shown and described with reference to the specific embodiments. However, it should be noted that the present invention is in no way limited to the details of the illustrated structures but changes and modifications may be made within the scope of the appended claims.

What is claimed is:

1. A semiconductor memory comprising at least a first memory cell and a second memory cell associated to a first bit line and a second bit line, respectively, which constitute a pair of bit lines precharged to a reference potential before data is read out, a sense amplifier connected to said first and second bit lines and selectively activated for comparing, when one memory cell of said first and second memory cells is selected and electrically connected to the bit line associated with the selected memory cell, a potential on said bit line connected to said selected memory cell with a potential on the bit line associated with a non-selected memory cell of said first and second memory cells, so as to output the result of comparison as a read-out data, and a reference potential setting means connected to said first and second bit lines, for selectively setting said bit line associated with said non-selected memory cell to said reference potential before said sense amplifier is activated.

2. A semiconductor memory claimed in claim 1 wherein said reference potential setting means sets said bit line associated with said non-selected memory cell, to said reference potential at least one time during a period after said selected memory cell is electrically connected to said bit line associated with said selected memory cell, but before said sense amplifier is activated.

3. A semiconductor memory claimed in claim 2 wherein each of said first and second memory cells is a DRAM cell.

4. A semiconductor memory claimed in claim 2 wherein said reference potential setting means includes a switching means for selectively electrically connecting said bit line associated with said non-selected memory cell, to a line for supplying said reference potential.

5. A semiconductor memory claimed in claim 4 wherein each of said fist and second memory cells is a DRAM cell.

6. A semiconductor memory claimed in claim 4 wherein said switching means includes a first transistor connected between said first bit line and said line for supplying said reference potential, and a second transistor connected between said second bit line and said line for supplying said reference potential, said first transistor and said second transistor being controlled by different activation signals to selectively electrically connect said bit line associated with said non-selected memory cell, to said line for supplying said reference potential.

7. A semiconductor memory claimed in claim 6 wherein each of said first and second memory cells is a DRAM cell.

8. A semiconductor memory claimed in claim 1 wherein a precharge circuit is connected to said first bit line and said second bit line and a line for supplying said reference potential and is controlled to precharge both said first bit line and said second bit line to said reference potential before said selected memory cell is electrically connected to said bit line associated with said selected memory cell, said precharge circuit operating as said reference potential setting means, by setting said bit line associated with said non-selected memory cell, to said reference potential at least one time during a period after said selected memory cell is electrically connected to said bit line associated with said selected memory cell, but before said sense amplifier is activated.

9. A semiconductor memory claimed in claim 8 wherein said precharge circuit includes a first transistor having a main current path connected between said first bit line and said line for supplying said reference potential, a second transistor having a main current path connected between said second bit line and said line for supplying said reference potential, a control electrode of each of said first and second transistors being connected to receive a first activation signal, a third transistor having a main current path connected between said first bit line and said line for supplying said reference potential and having a control electrode connected to receive a second activation signal, and a fourth transistor having a main current path connected between said second bit line and said line for supplying said reference potential and a control electrode connected to receive a third activation signal, so that when said first memory cell is selected to be read, first, both said first and second transistor are activated by said first activation signal to precharge said first bit line and said second bit line to said reference potential, and then, after said first and second transistors are deactivated, said first memory cell is selected and electrically connected to said first bit line, and then, said fourth transistor is activated by said third activation signal to bring said second bit line to said reference potential, and on the other hand, said third transistor is maintained in a deactivated condition by said second activation signal, and then, after said fourth transistor is put in a deactivated condition by said third activation signal, said sense amplifier is activated.

10. A semiconductor memory claimed in claim 9 wherein said precharge circuit further includes a fifth transistor having a main current path connected between said first bit line and said second bit line and having a control electrode connected to receive said first activation signal, so that when both said first and second transistor are activated by said first activation signal, said fifth transistor is also activated by said first activation signal for equalizing a potential on said first bit line and a potential on said second bit line.

11. A semiconductor memory claimed in claim 8 wherein said precharge circuit includes a first transistor having a main current path connected between said first bit line and said line for supplying said reference potential and having a control electrode connected to receive a first activation signal, and a second transistor having a main current path connected between said second bit line and said line for supplying said reference potential and a control electrode connected to receive a second activation signal, so that when said first memory cell is selected to be read, first, both said first and second transistor are activated by said first activation signal and said second activation signal to precharge said first bit line and said second bit line to said reference potential, and then, after only said first transistor is deactivated by said first activation signal, said second transistor is maintained in an activated condition by said second activation signal and said first memory cell is selected and electrically connected to said first bit line, and then, after said second transistor if put in a deactivated condition by said second activation signal, said sense amplifier is activated.

12. A semiconductor memory claimed in claim 9 wherein said precharge circuit further includes a third transistor having a main current path connected between said first bit line and said second bit line and having a control electrode connected to receive a third activation signal, so that when both said first and second transistor are activated by said first activation signal and said second activation signal to precharge said first bit line and said second bit line to said reference potential, said third transistor is activated by said third activation signal for equalizing a potential on said first bit line and a potential on said second bit line.

13. A DRAM comprising at least a first bit line and a second bit line which constitute a pair of bit lines precharged to a reference potential before data is read out, a first DRAM cell having a first storage capacitor having one end connected to ground and a first switching transistor having a main current path connected between said first bit line and the other end of said first storage capacitor, a control electrode of said first switching transistor being connected to a first word line, a second DRAM cell having a second storage capacitor having one end connected to the ground and a second switching transistor having a main current path connected between said second bit line and the other end of said second storage capacitor, a control electrode of said second switching transistor being connected to a second word line, a sense amplifier connected to said first and second bit lines and selectively activated for comparing, when said first switching transistor of said first DRAM cell is turned on by activating said first word line, a potential on said first bit line with a potential on said second bit line, so as to amplify a potential difference between said first and second bit lines, and a reference potential setting means connected to said first and second bit lines, for selectively setting said second bit line to said reference potential after said first switching transistor of said first DRAM cell is turned on by activating said first word line thereof said sense amplifier is activated.

14. A semiconductor memory claimed in claim 13 wherein a precharge circuit is connected to said first bit line and said second bit line and a line for supplying said reference potential and is controlled to precharge both said first bit line and said second bit line to said reference potential before said first switching transistor of said first DRAM cell is turned on, said precharge circuit operating as said reference potential setting means, by setting said second bit line to said reference potential at least one time during a period after said first switching transistor of said first DRAM cell is turned on, but before said sense amplifier is activated.

15. A semiconductor memory claimed in claim 14 wherein said precharge circuit includes a first MOS transistor having a source-drain path connected between said first bit line and said line for supplying said reference potential, a second MOS transistor having a source-drain path connected between said second bit line and said line for supplying said reference potential, a gate electrode of each of said first and second MOS transistors being connected to receive a first activation signal, a third MOS transistor having a source-drain path connected between said first bit line and said line for supplying said reference potential and having a gate electrode connected to receive a second activation signal, and a fourth MOS transistor having a source-drain path connected between said second bit line and said line for supplying said reference potential and a gate electrode connected to receive a third activation signal, so that when said first DRAM cell is selected to be read, first, both said first and second MOS transistor are turned on by said first activation signal to electrically connect said first bit line and said second bit line to said reference potential for the purpose of precharging said first bit line and said second bit line, and then, after said first and second MOS transistor are turned off by said first activation signal, said first switching transistor of said first DRAM cell is turned on by activating said first word line so that said first storage capacitor is electrically connected to said first bit line, and then, said fourth MOS transistor is turned on by said third activation signal to electrically connect said second bit line to said line for supplying said reference potential for the purpose of bringing said second bit line to said reference potential, and on the other hand, said third MOS transistor is maintained in an off condition by said second activation signal, and then, after said fourth MOS transistor is turned off by said third activation signal, said sense amplifier is activated.

16. A semiconductor memory claimed in claim 15 wherein said precharge circuit further includes a fifth NIOS transistor having a source-drain path connected between said first bit line and said second bit line and having a gate electrode connected to receive said first activation signal, so that when both said first and second MOS transistor are turned on by said first activation signal, said fifth MOS transistor is also turned on by said first activation signal for equalizing a potential on said first bit line and a potential on said second bit line.

17. A semiconductor memory claimed in claim 14 wherein said precharge circuit includes a first MOS transistor having a source-drain path connected between said first bit line and said line for supplying said reference potential and having a gate electrode connected to receive a first activation signal, and a second MOS transistor having a source-drain path connected between said second bit line and said line for supplying said reference potential and a gate electrode connected to receive a second activation signal, so that when said first DRAM cell is selected to be read, first, both said first and second MOS transistor are turned on by said first activation signal and said second activation signal to electrically connect said first bit line and said second bit line to said line for supplying said reference potential for the purpose of precharging said first bit line and said second bit line to said reference potential, and then, after only said first MOS transistor is turned off by said first activation signal, said second MOS transistor is maintained in an on condition by said second activation signal, and said first switching transistor of said first DRAM cell is turned on by activating said first word line so that said first storage capacitor is electrically connected to said first bit line, and on the other hand, said second bit line is maintained at said reference potential by action of said second MOS transistor which is maintained in the on condition, and then, after said second MOS transistor is put in an off condition by said second activation signal, said sense amplifier is activated.

18. A semiconductor memory claimed in claim 17 wherein said precharge circuit further includes a third MOS transistor having a source-drain path connected between said first bit line and said second bit line and having a gate electrode connected to receive a third activation signal, so that when both said first and second MOS transistor are turned on by said first activation signal and said second activation signal to precharge said first bit line and said second bit line to said reference potential, said third MOS transistor is also turned on by said third activation signal for equalizing a potential on said first bit line and a potential on said second bit line.

* * * * *